(12) United States Patent
Kimura

(10) Patent No.: US 11,855,528 B2
(45) Date of Patent: Dec. 26, 2023

(54) POWER CONVERSION APPARATUS

(71) Applicant: Panasonic Intellectual Property Management Co., Ltd., Osaka (JP)

(72) Inventor: Shinya Kimura, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 153 days.

(21) Appl. No.: 17/415,562

(22) PCT Filed: Dec. 18, 2019

(86) PCT No.: PCT/JP2019/049511
§ 371 (c)(1),
(2) Date: Jun. 17, 2021

(87) PCT Pub. No.: WO2020/137721
PCT Pub. Date: Jul. 2, 2020

(65) Prior Publication Data
US 2022/0061186 A1 Feb. 24, 2022

(30) Foreign Application Priority Data
Dec. 26, 2018 (JP) ................. 2018-242430

(51) Int. Cl.
*H01L 23/36* (2006.01)
*H02M 3/00* (2006.01)
(Continued)

(52) U.S. Cl.
CPC ........ *H02M 3/003* (2021.05); *H01L 23/3677* (2013.01); *H05K 5/0026* (2013.01); *H05K 7/209* (2013.01)

(58) Field of Classification Search
None
See application file for complete search history.

(56) References Cited

U.S. PATENT DOCUMENTS 4,707,726 A * 11/1987 Tinder ................ H01L 23/4093
257/796
5,309,979 A * 5/1994 Brauer ................ H01L 23/4093
174/16.3
(Continued)

FOREIGN PATENT DOCUMENTS

JP         S6376462 A     4/1988
JP       2003-023280 A   1/2003
(Continued)

OTHER PUBLICATIONS

International Search Report, dated Mar. 10, 2020, for International Application No. PCT/JP2019/049511, 2 pages.
(Continued)

*Primary Examiner* — Courtney L Smith
(74) *Attorney, Agent, or Firm* — Seed IP Law Group LLP

(57) ABSTRACT

A power conversion apparatus, comprising: a semiconductor component for power conversion; a heat transfer member to which the semiconductor component is fixed such that the heat transfer member is thermally connected to a heat dissipation surface formed on at least one surface of the semiconductor component; and a housing, wherein the housing includes a heat dissipation wall portion, a fitting portion that fits to the heat transfer member is formed on the heat dissipation wall portion at an inside of the housing space, an area of contact between the fitting portion and the heat transfer member is greater than an area of the heat dissipation surface of the semiconductor component, and an occupied area of the fitting portion as seen in plan view is smaller than an area of the at least one surface of the semiconductor component on which the heat dissipation surface is formed.

15 Claims, 13 Drawing Sheets

(51) Int. Cl.
    *H01L 23/367*     (2006.01)
    *H05K 5/00*     (2006.01)
    *H05K 7/20*     (2006.01)

(56) References Cited

U.S. PATENT DOCUMENTS

| | | | | |
|---|---|---|---|---|
| 5,313,701 | A * | 5/1994 | Klinger | H05K 7/20854 |
| | | | | 324/555 |
| 9,179,581 | B2 * | 11/2015 | Suwa | H01L 24/40 |
| 9,578,790 | B2 * | 2/2017 | Kodama | B60L 3/003 |
| 2013/0058068 | A1 | 3/2013 | Funatsu | |
| 2013/0154084 | A1 | 6/2013 | Kadoguchi et al. | |
| 2013/0270024 | A1 | 10/2013 | Matsuda | |
| 2014/0252587 | A1 * | 9/2014 | Kodama | H05K 7/2049 |
| | | | | 257/712 |

FOREIGN PATENT DOCUMENTS

| | | | |
|---|---|---|---|
| JP | 2007329167 A | 12/2007 | |
| JP | 2009231672 A | 10/2009 | |
| JP | 2011172354 A | 9/2011 | |
| JP | 2013055840 A | 3/2013 | |
| WO | WO 2012029165 A1 | 3/2012 | |
| WO | WO 2012090241 A1 | 7/2012 | |
| WO | WO-2020137721 A1 * | 7/2020 | ......... H01L 23/3677 |

OTHER PUBLICATIONS

English Translation of Chinese Office Action dated Aug. 21, 2023, for the corresponding Chinese Patent Application No. 201980085644. 6, 12 pages.

English Translation of Japanese Office Action, dated Oct. 3, 2023, for the corresponding Japanese Patent Application No. 2023-017814, 4 pages.

* cited by examiner

POWER CONVERSION APPARATUS

TECHNICAL FIELD

The present disclosure relates to a power conversion apparatus.

BACKGROUND ART

Conventionally, a power conversion apparatus mounted on an electric vehicle, a railway vehicle, or the like (e.g., a DCDC converter apparatus, an inverter apparatus, a charging apparatus, and the like) is known (e.g., see Patent Literature (hereinafter, referred to as "PTL") 1).

CITATION LIST

Patent Literature

PTL 1
Japanese Patent Application Laid-Open No. 2003-23280

SUMMARY OF INVENTION

Technical Problem

Meanwhile, for this type of power conversion apparatus, there has been an increasing demand for miniaturization, and accordingly, the space saving for component arrangement in the power conversion apparatus has been an objective.

In view of this background, it has been considered to house a power semiconductor module being a component of this type of power conversion apparatus in a housing of the power conversion apparatus such that the power semiconductor module is in a vertically placed state (the vertically placed state represents a state in which the power semiconductor module is disposed such that the longitudinal direction of the power semiconductor module is orthogonal to the lower surface of the housing; the same shall apply hereinafter).

However, the power semiconductor module used in this type of power conversion apparatus produces a large amount of heat. Thus, when considering an aspect of how the power semiconductor module is disposed, it is necessary to also consider heat dissipation measures for heat from the power semiconductor module. In this regard, when the power semiconductor module is vertically placed without any contrivance, the area of the side surfaces of the power semiconductor module which can come into contact with the housing is reduced. Thus, it may be impossible to ensure heat dissipation capacity for heat from the power semiconductor module sufficiently.

The present disclosure has been made in view of the above problem, and aims to provide a power conversion apparatus that allows an arrangement in which a power semiconductor module is vertically placed and that is capable of sufficiently ensuring a heat dissipation capacity for heat from the power semiconductor module.

Solution to Problem

Principally, the present disclosure that solves the aforementioned problem is a power conversion apparatus including:
a semiconductor component for power conversion;
a heat transfer member to which the semiconductor component is fixed such that the heat transfer member is thermally connected to a heat dissipation surface formed on at least one surface of the semiconductor component; and
a housing having a housing space for housing the semiconductor component and the heat transfer member, in which
the housing includes a heat dissipation wall portion facing a refrigerant at an outside of the housing space,
a fitting portion that fits to the heat transfer member is formed on the heat dissipation wall portion at an inside of the housing space,
an area of contact between the fitting portion and the heat transfer member is greater than an area of the heat dissipation surface of the semiconductor component, and
an occupied area of the fitting portion as seen in plan view is smaller than an area of the at least one surface of the semiconductor component on which the heat dissipation surface is formed.

Advantageous Effects of Invention

A power conversion apparatus according to the present disclosure allows an arrangement in which a power semiconductor module is vertically placed, and is capable of sufficiently ensuring a heat dissipation capacity for heat from the power semiconductor module.

DESCRIPTION OF EMBODIMENTS

Hereinafter, preferred embodiments of the present disclosure will be described in detail with reference to the appended drawings. In addition, in the present specification and drawings, components having substantially the same functions are provided with the same reference symbols, and redundant description will be omitted.

Note that, the following description will be given in which the upper direction in the figures is referred to as "upper direction," and the lower direction in the figures is referred to as "lower direction" in order to clarify the positional relationship of each configuration. However, these directions do not limit the attitude of a power conversion apparatus in use.

Embodiment 1

[Configuration of Power Conversion Apparatus]

Hereinafter, an example of the configuration of the power conversion apparatus according to the present embodiment will be described with reference to FIGS. 1 to 5. Note that, here, a description will be given of only a heat sink structure for cooling a power semiconductor module that the power conversion apparatus includes.

Power conversion apparatus 1 according to the present embodiment is applied, for example, to a DC/DC converter apparatus, an inverter apparatus, a charging apparatus, and the like mounted on a vehicle such as an electric vehicle.

Figure 1:
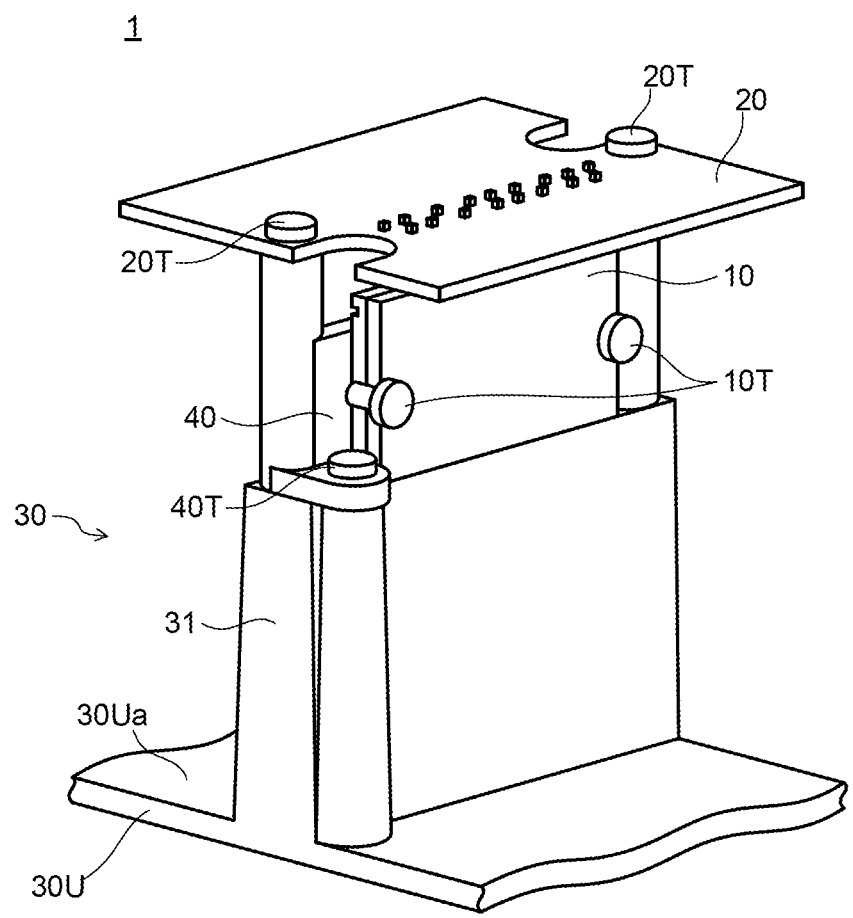
FIG. 1 is a perspective view illustrating a heat sink structure of a power conversion apparatus according to Embodiment 1.
Figure 2:
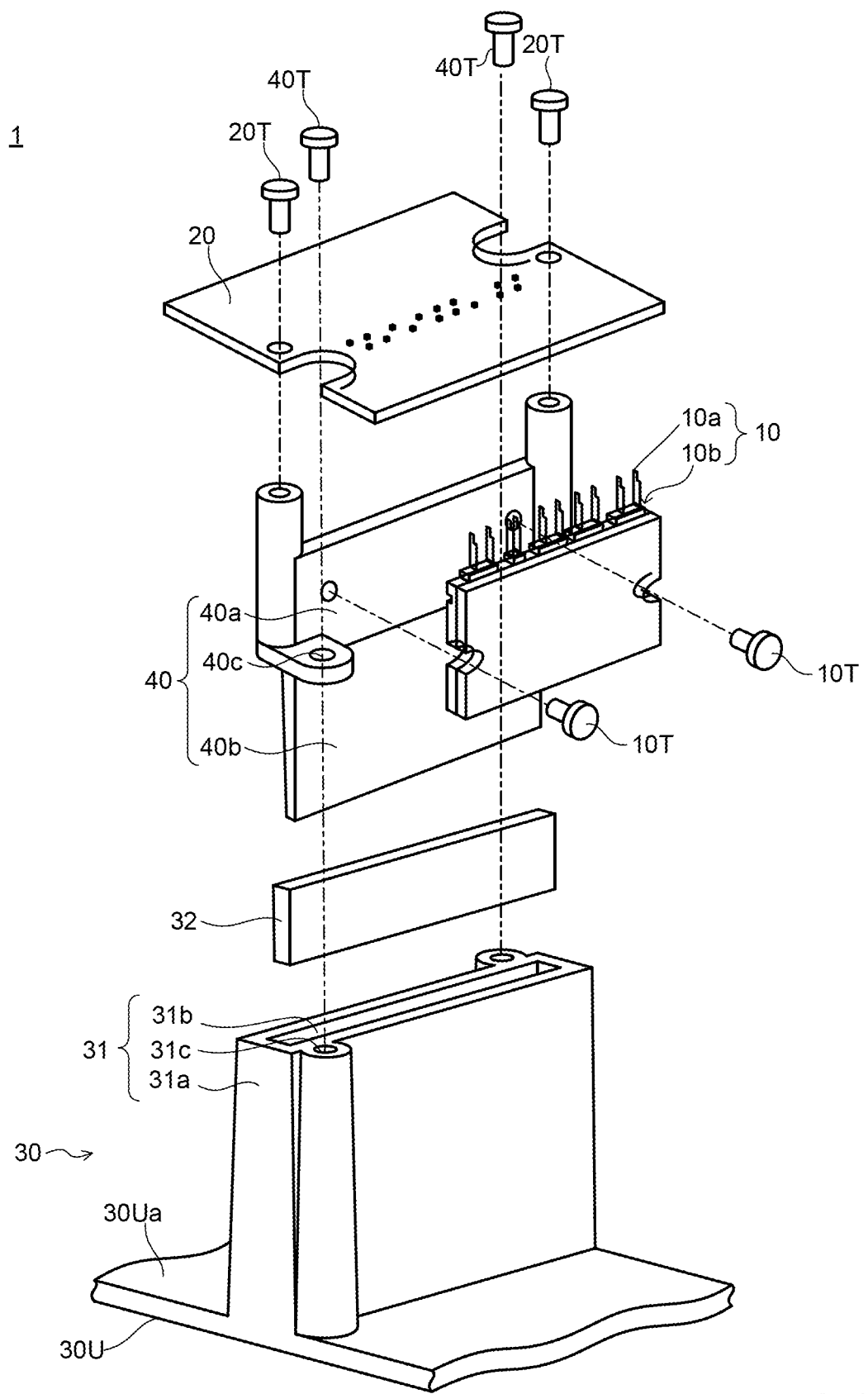
FIG. 2 is an exploded perspective view illustrating the heat sink structure of the power conversion apparatus according to Embodiment 1.
Figure 3:
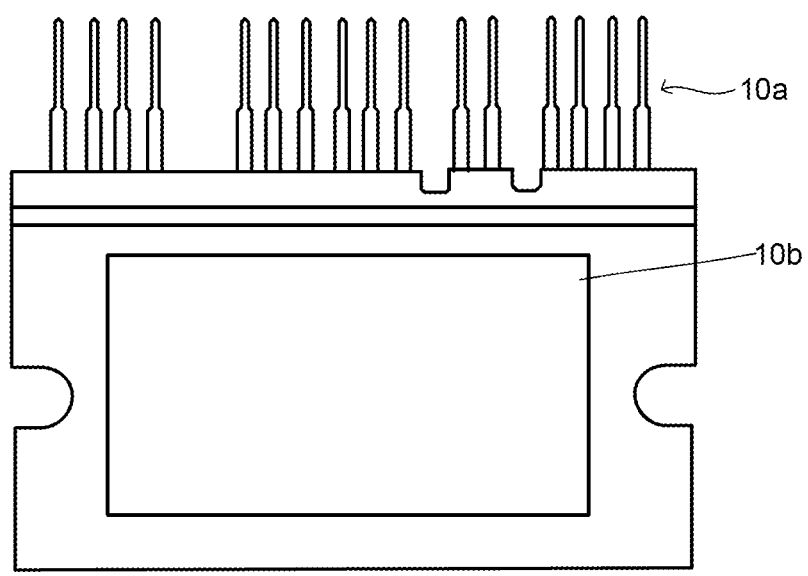
FIG. 3 is a plan view illustrating a configuration of a power semiconductor module according to Embodiment 1.
Figure 4:
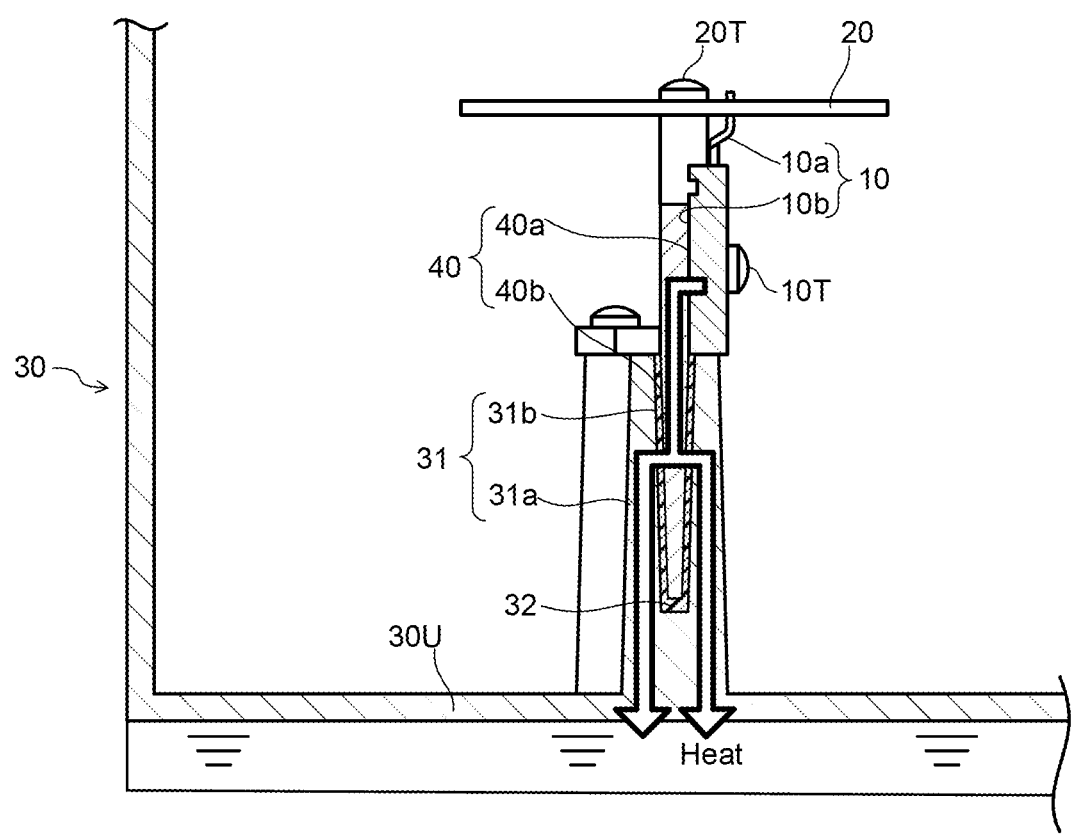
FIG. 4 is a sectional side view illustrating the heat sink structure of the power conversion apparatus according to Embodiment 1.

FIG. 1 is a perspective view illustrating the heat sink structure of power conversion apparatus 1 according to the present embodiment. FIG. 2 is an exploded perspective view illustrating the heat sink structure of power conversion apparatus 1 according to the present embodiment. FIG. 3 is a plan view illustrating the configuration of power semiconductor module 10. FIG. 4 is a sectional side view illustrating the heat sink structure of power conversion apparatus 1 according to the present embodiment.

Power conversion apparatus 1 includes power semiconductor module 10, circuit board 20, metal housing 30, and heat sink plate 40.

In power conversion apparatus 1, the heat sink structure for cooling power semiconductor module 10 is formed by heat sink plate 40 that holds power semiconductor module 10, and fitting portion 31 to which heat sink plate 40 is fitted and fixed and that is formed on metal housing 30.

Power semiconductor module 10 is a semiconductor component for power conversion that functions as a switching element in a circuit section of power conversion apparatus 1, for example. Power semiconductor module 10 is composed, for example, of four power semiconductor devices (e.g., MOSFETs) packaged into one module. Power semiconductor module 10 includes, at its upper end, pin-type terminals 10a for electrical connection to circuit board 20. Further, power semiconductor module 10 includes, at at least one lateral side surface, heat dissipation surface 10b for dissipating heat generated by the power semiconductor module.

Power semiconductor module 10 is held in a vertically placed state by heat sink plate 40 such that terminals 10a point upward and heat dissipation surface 10b extends along the upper-lower direction. Note that, power semiconductor module 10 is fixed to heat sink plate 40, for example, with bolts 10T (corresponding to the "fastening member" of the present invention). Thus, as compared with a case where power semiconductor module 10 is fixed to heat sink plate 40 only by an adhesive, the distance (gap) between power semiconductor module 10 and heat sink plate 40 can be shortened, resulting in a reduction of the thermal resistance (to increase the heat transfer property) between power semiconductor module 10 and heat sink plate 40. Note that, a configuration may also be employed in which heat dissipating grease (not illustrated) is interposed between power semiconductor module 10 and heat sink plate 40. This configuration makes it possible to further reduce the thermal resistance (increase the heat transfer property) between power semiconductor module 10 and heat sink plate 40.

Further, as described in the below-described "assembly process," power semiconductor module 10 is fixed to heat sink plate 40 before the heat sink plate is housed in metal housing 30. It is thus possible to shorten the distance (gap) between power semiconductor module 10 and heat sink plate 40 easily.

Further, fastening power semiconductor module 10 to heat sink plate 40 with bolts 10T makes it possible to reduce the possibility that power semiconductor module 10 comes off heat sink plate 40 due to vibration of the vehicle (in other words, vibration resistance is improved).

Circuit board 20 is a board having a circuit section for implementing a power conversion function of power conversion apparatus 1. Circuit board 20 is disposed above power semiconductor module 10 to extend substantially parallel to flat portion 30Ua of lower-surface-side wall portion 30U of metal housing 30 (the flat portion represents a region of lower-surface-side wall portion 30U other than below-described fitting portion 31; the same applies hereinafter). In addition, circuit board 20 is fixed to the upper end of heat sink plate 40 with bolts 20T.

Circuit board 20 is disposed such that terminals 10a of power semiconductor module 10 are inserted from below in through-holes for electrical connection formed in the board surface. Thus, circuit board 20 is electrically connected to power semiconductor module 10.

Metal housing 30 houses power semiconductor module 10, circuit board 20, heat sink plate 40, and other electrical components constituting power conversion apparatus 1. In order to protect the electrical components to be housed from surrounding moisture and the like, metal housing 30 houses these electrical components in a sealed state (only a part of the wall surface is illustrated in FIGS. 1 and 2 for convenience of description). Metal housing 30 is formed of, for example, an aluminum member in a substantially rectangular parallelepiped shape. Note that, metal housing 30 may be formed using another metal member such as copper or iron. Further, although described as metal housing 30 in the present exemplary embodiment, the housing may not be metal as long as housing 30 has a heat dissipation property. For example, the housing may be made of a polybutylene terephthalate resin or a polyphenylene sulfide resin.

Further, metal housing 30 has a configuration having a substantially rectangular parallelepiped shape in which lower-surface-side wall portion 30U and four sidewalls substantially orthogonally extending from the outer periphery of lower-surface-side wall portion 30U are formed integrally. A lid is placed to cover an open upper surface of the metal housing for protection against ambient moisture and the like. (See FIG. 5)

With this configuration, the space covered by lower-surface-side wall portion 30U, the four sidewalls, and the lid serves as a housing space for housing power semiconductor module 10, circuit board 20, heat sink plate 40, and the like.

Figure 5:
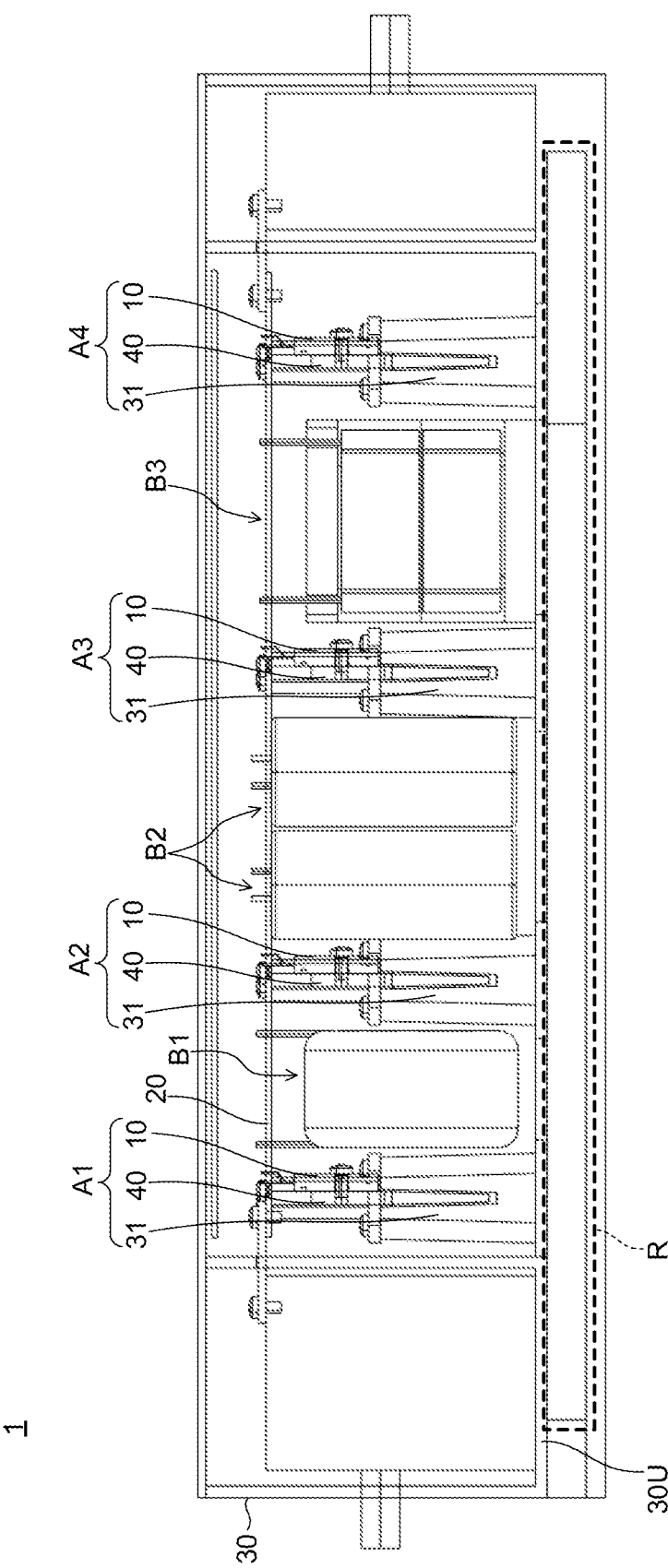
FIG. 5 is a sectional side view illustrating an overall configuration of the power conversion apparatus according to Embodiment 1.

Note that, the height of the sidewalls formed integrally with lower-surface-side wall portion 30U is higher than the height to bolts 10T after power semiconductor module 10 is housed and disposed in metal housing 30 (see FIGS. 4 and 5). That is, since the sidewalls of metal housing 30 are present, fastening power semiconductor module 10 with bolts 10T in the horizontal direction after power semiconductor module 10 is housed and disposed in metal housing 30 is difficult.

Therefore, in the present application, a configuration is employed in which heat sink plate 40 is separately provided, heat sink plate 40 is disposed in metal housing 30 after power semiconductor module 10 is fastened to heat sink plate 40, and heat sink plate 40 can be fixed to metal housing 30 (fitting portion 31) with bolts 40T from above in the vertical direction.

Thus, even with metal housing 30 having a substantially rectangular parallelepiped shape which is open only at the upper surface, it is made possible to fasten power semiconductor module 10 to heat sink plate 40 with bolts 10T (i.e., to shorten the distance (gap) to enhance the heat transfer property), and to fix power semiconductor module 10 to metal housing 30 via heat sink plate 40.

Note that, using metal housing 30 having the configuration in which the lid is placed on the substantially rectangular parallelepiped shape that is open only at the upper surface makes it easier to dispose an input connector or an output connector of power conversion apparatus 1 in the sidewalls of metal housing 30 than in a configuration in which a lid composed of sidewalls and an upper wall integrally molded is placed on the shape made only of a lower-surface-side wall portion.

Metal housing 30 is disposed to make contact with a refrigerant (here, water refrigerant) at the outside of lower-surface-side wall portion 30U of the metal housing. Heat generated by power semiconductor module 10 is released to the outside via lower-surface-side wall portion 30U.

Metal housing 30 includes, inside its lower-surface-side wall portion 30U, fitting portion 31 to which heat sink plate 40 is fitted and fixed and which has the shape with indentations and protrusions. Fitting portion 31 is formed integrally with lower-surface-side wall portion 30U as a part of lower-surface-side wall portion 30U. Heat sink plate 40 is fitted and fixed to fitting portion 31 in a vertically placed state (the vertically placed state represents a state in which heat sink plate 40 extends along the upper-lower direction; the same shall apply hereinafter).

Fitting portion 31 is configured to include, for example, protruding portion 31a protruding upward from flat portion 30Ua of lower-surface-side wall portion 30U, and slit portion 31b extending along the upper-lower direction from the upper end of protruding portion 31a toward the inside of protruding portion 31a and being configured such that heat sink plate 40 is insertable into the slit portion.

Slit portion 31b has a shape following the outer shape of heat sink plate 40 (insertion portion 40b). Here, slit portion 31b is configured such that heat sink plate 40 is insertable in the slit portion along the plate surface of heat sink plate 40.

Heat transfer material 32 for enhancing thermal coupling between heat sink plate 40 (insertion portion 40b) and fitting portion 31 is disposed in slit portion 31b. Heat transfer material 32 is typically made of a gel-like resin, a thermosetting resin (e.g., an epoxy resin), or the like. When heat transfer material 32 is made of a member having adhesiveness such as a thermosetting resin, the effect that heat sink plate 40 can be further fixed can be obtained. However, a potting material may be used as a material for enhancing the thermal coupling between heat sink plate 40 (insertion portion 40b) and fitting portion 31.

Note that, bolt holes 31c for fastening with bolts 40T are disposed in the upper surface of fitting portion 31.

Heat transfer material 32 is disposed to fill a gap between heat sink plate 40 (insertion portion 40b) and the inner wall of protruding portion 31a. Note that, for example, heat transfer material 32 is disposed by filling slit portion 31b with the heat transfer material in a liquid state in advance, such that the heat transfer material is solidified after heat sink plate 40 is inserted into slit portion 31b. However, heat transfer material 32 may be configured to fill the inside of fitting portion 31 additionally in a state where heat sink plate 40 is inserted into slit portion 31b. Note that, heat transfer material 32 may be a material semi-solidified to such an extent that liquid does not leak.

Heat sink plate 40 is a heat transfer member that holds power semiconductor module 10 and cools power semiconductor module 10 by transferring heat generated by power semiconductor module 10 to lower-surface-side wall portion 30U. Heat sink plate 40 has, for example, a plate shape.

Heat sink plate 40 includes, at the upper side of its side surface, attachment portion 40a to which power semiconductor module 10 is attached, and includes, at the lower side of its side surface, insertion portion 40b that is fitted to fitting portion 31.

Attachment portion 40a has a planar shape (here, flat shape) corresponding to the planar shape of heat dissipation surface 10b of power semiconductor module 10, and holds power semiconductor module 10 while making surface contact with (while thermally connected to) heat dissipation surface 10b of power semiconductor module 10. Here, attachment portion 40a holds power semiconductor module 10 in the vertically placed state. Note that, power semiconductor module 10 is fixed to attachment portion 40a with bolts 10T.

Insertion portion 40b is fitted to fitting portion 31 such that heat sink plate 40 is brought into the vertically placed state (i.e., extends in a substantially vertical direction). More specifically, insertion portion 40b is inserted into slit portion 31b of metal housing 30 along the extending direction of heat sink plate 40. In addition, insertion portion 40b is disposed in slit portion 31b to make contact with the inner wall of protruding portion 31a and is thermally coupled with protruding portion 31a. Note that, insertion portion 40b may be thermally coupled to protruding portion 31a in slit portion 31b only via heat transfer material 32 without making contact with the inner wall of protruding portion 31a.

Further, heat sink plate 40 includes through-holes 40c in which bolts 40T are inserted. Through-holes 40c as seen in top view are disposed to overlap with bolt holes 31c of fitting portion 31. Bolts 40T (corresponding to the "fastening member" of the present invention) are inserted into bolt holes 31c of fitting portion 31 from above heat sink plate 40 through through-holes 40c of heat sink plate 40, and are fastened and fixed. Thus, heat sink plate 40 is fixed to fitting portion 31.

Heat sink plate 40 thus receives, at attachment portion 40a, the transfer of heat generated by power semiconductor module 10, and transfers, at insertion portion 40b, the heat to protruding portion 31a of metal housing 30.

Note that, the shapes of heat sink plate 40 and fitting portion 31 can be variously modified. However, these shapes are set to satisfy the following two conditions.

The first condition is that the area of contact between fitting portion 31 and heat sink plate 40 is greater than the area of heat dissipation surface 10b of power semiconductor module 10. The second condition is that the occupied area of fitting portion 31 as seen in plan view (i.e., the area occupied by fitting portion 31 with respect to lower-surface-side wall portion 30U of metal housing 30) is smaller than the area of one surface of power semiconductor module 10 on which heat dissipation surface 10b is formed.

When the shapes of heat sink plate 40 and fitting portion 31 are designed to satisfy the first condition and the second condition, it is possible to avoid a situation where a space required for disposing power semiconductor module 10 is larger than in a case where power semiconductor module 10 is horizontally placed, and/or a situation where the heat dissipation rate of heat from power semiconductor module 10 is limited to the heat dissipation rate at the contact region between fitting portion 31 and heat sink plate 40.

Note that, when the first condition and the second condition are satisfied, it is possible to reduce the required space (occupied area) of lower-surface-side wall portion 30U for heat dissipation for power semiconductor module 10 (the heat dissipation wall portion of metal housing 30 facing the refrigerant at the outside of the housing space). It is further preferable that the total area of power semiconductor module 10 and heat sink plate 40 as seen in plan view be smaller than the area of one surface of power semiconductor module 10 on which heat dissipation surface 10b is formed.

With this configuration, it is possible to reduce not only the occupied area of lower-surface-side wall portion 30U but also a horizontal required space (occupied area) for heat dissipation for power semiconductor module 10.

FIG. 5 is a sectional side view illustrating an overall configuration of power conversion apparatus 1 according to the present embodiment.

FIGS. 1, 2, and 4 illustrate only the heat sink structure for one power semiconductor module 10, power conversion apparatus 1 according to the present embodiment houses a plurality of such power semiconductor modules 10. Each of the plurality of power semiconductor modules 10 is provided with the same heat sink structure.

In FIGS. 5, A1, A2, A3, and A4 illustrate power semiconductor modules 10 and heat sink structures for cooling power semiconductor modules 10, respectively. In addition, B1, B2, and B3 illustrate other electrical components (e.g., a capacitor, a coil, and the like) included in power conversion apparatus 1. Further, area R illustrates a refrigerant flow path (here, a water flow path) of a refrigerant flow flowing at the outside of lower-surface-side wall portion 30U of metal housing 30. Note that, the refrigerant is not limited to cooling water, and may also be air by a fan and/or a wind caused during traveling.

In metal housing 30, the plurality of power semiconductor modules 10 are arranged below circuit board 20 in a vertically placed state as illustrated in FIG. 5. The plurality of power semiconductor modules 10 are electrically connected to circuit board 20.

A plurality of heat sink plates 40 are disposed to respectively hold a plurality of power semiconductor modules 10, and a plurality of fitting portions 31 are formed on lower-surface-side wall portion 30U such that the plurality of heat sink plates 40 are fitted and fixed to the plurality of fitting portions 31, respectively.

That is, the plurality of power semiconductor modules 10 are held respectively by the heat sink structures formed by the plurality of fitting portions 31 formed on lower-surface-side wall portion 30U and the plurality of heat sink plates 40.

Thus, it is possible to save space for arrangement of components in metal housing 30 by arranging power semiconductor modules 10 in a vertically placed state.

Note that, the other electrical components (e.g., the capacitor, coil, and the like) B1, B2, and B3 housed in metal housing 30 are disposed below circuit board 20 similarly to power semiconductor modules 10. These electrical components B1, B2, and B3 extend to a position higher than the position of the upper ends of fitting portions 31.

[Heat Transfer Path in Heat Sink Structure of Power Conversion Apparatus]

Here, with reference to FIG. 4, a heat transfer path in each of the heat sink structures of power conversion apparatus 1 according to the present embodiment will be described. Note that, arrow "Heat" in FIG. 4 represents a heat flow (flow of heat) of heat generated by power semiconductor module 10.

First, the heat generated by power semiconductor module 10 is transferred to attachment portion 40a of heat sink plate 40 via heat dissipation surface 10b of power semiconductor module 10. Then, the heat transferred to attachment portion 40a of heat sink plate 40 is transferred to fitting portion 31 of metal housing 30 via insertion portion 40b of heat sink plate 40 (and heat transfer material 32). Then, the heat transferred to fitting portion 31 of metal housing 30 is dissipated to the refrigerant at the outside of lower-surface-side wall portion 30U of metal housing 30.

Here, the heat sink structure of power conversion apparatus 1 according to the present embodiment has the configuration in which the contact region between attachment portion 40a of heat sink plate 40 and heat dissipation surface 10b of power semiconductor module 10 extends along the upper-lower direction, and, the contact region between insertion portion 40b of heat sink plate 40 and fitting portion 31 extends along the upper-lower direction. Thus, it is possible to sufficiently ensure heat dissipation paths at the regions between members, so as to reduce the thermal resistance between the members.

In addition, in the heat sink structure of power conversion apparatus 1 according to the present embodiment, fitting portion 31 is formed as a part of lower-surface-side wall portion 30U. Thus, as compared with a case where fitting portion 31 and lower-surface-side wall portion 30U are formed separately and fastened to each other, the thermal resistance between fitting portion 31 and lower-surface-side wall portion 30U is reduced, and heat can be smoothly transferred from fitting portion 31 to the refrigerant disposed outside lower-surface-side wall portion 30U.

[Assembly Process of Power Conversion Apparatus]

Hereinafter, with reference to FIGS. 6A to 6D, an example of an assembly process for housing power semiconductor module 10 in metal housing 30 in a manufacturing process of power conversion apparatus 1 according to the present embodiment will be described.

FIGS. 6A to 6D illustrate the assembly process of power conversion apparatus 1 according to the present embodiment. FIGS. 6A, 6B, 6C, and 6D illustrate the states of the components in chronological order. Note that, in the present embodiment, power semiconductor module 10 is attached to the inside of power conversion apparatus 1 using an automatic conveying apparatus.

Figure 6A:
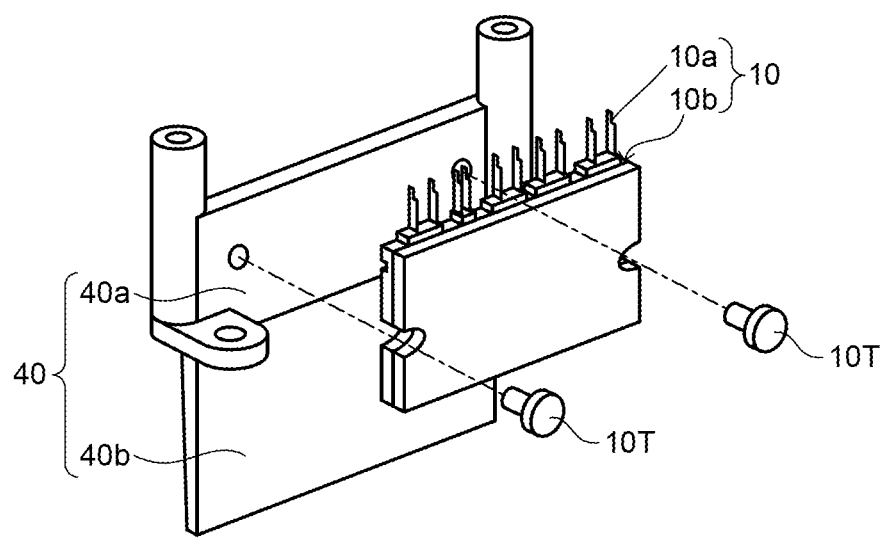
FIG. 6A illustrates an assembly process of the power conversion apparatus according to Embodiment 1.

To begin with, the automatic conveying apparatus attaches power semiconductor module 10 to attachment portion 40a of heat sink plate 40 using bolts 10T (see FIG. 6A).

Figure 6B:
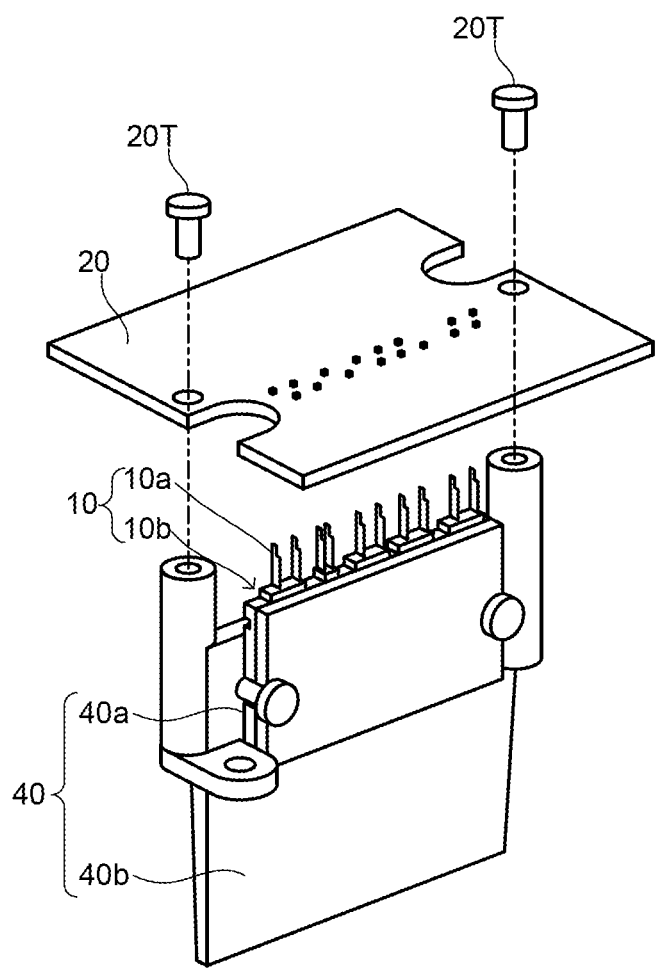
FIG. 6B illustrates the assembly process of the power conversion apparatus according to Embodiment 1.

Next, the automatic conveying apparatus attaches circuit board 20 to the upper end portion of heat sink plate 40 using bolts 20T (see FIG. 6B).

Figure 6C:
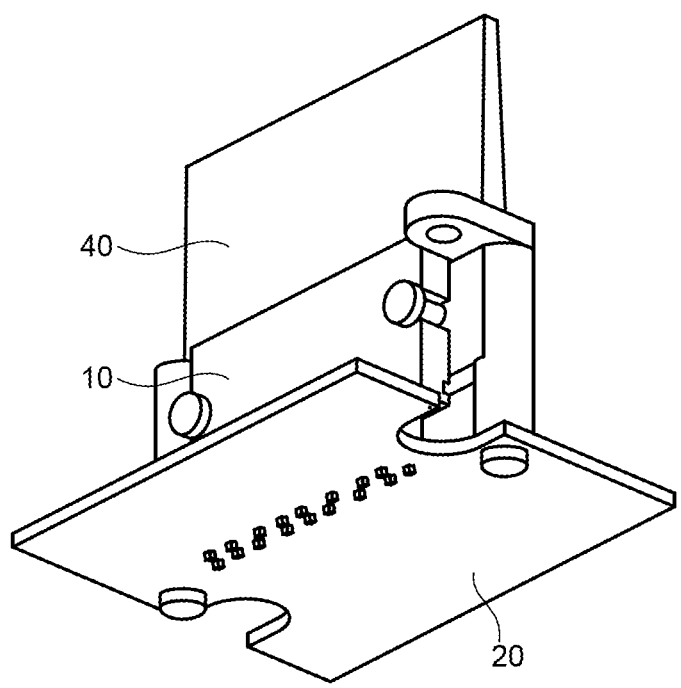
FIG. 6C illustrates the assembly process of the power conversion apparatus according to Embodiment 1.

Next, the automatic conveying apparatus inserts the terminals of power semiconductor module 10 into the through-holes formed in circuit board 20 to electrically connect them by solder connection (see FIG. 6C).

Figure 6D:
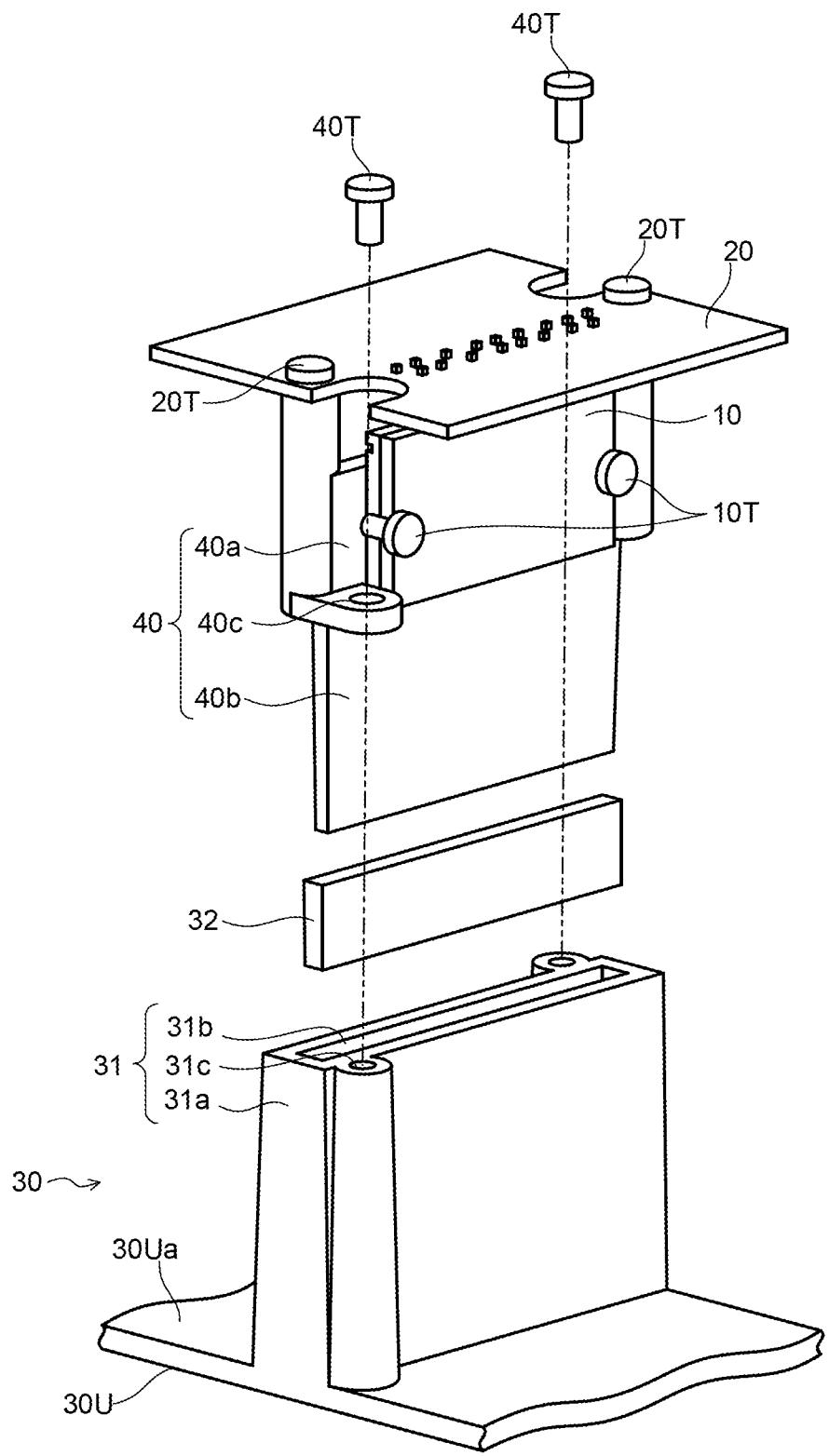
FIG. 6D illustrates the assembly process of the power conversion apparatus according to Embodiment 1.

Next, the automatic conveying apparatus inserts insertion portion 40b of heat sink plate 40 into fitting portion 31 of metal housing 30 (slit portion 31b) after injecting liquid heat transfer material 32 (here, thermosetting resin) into fitting portion 31 of metal housing 30 (slit portion 31b) (see FIG. 6D). Then, the automatic conveying apparatus fixes heat sink plate 40 to fitting portion 31 of metal housing 30 using bolts 40T. Then, heat transfer material 32 is thermally cured.

Through the process described above, power semiconductor module 10 can be housed in metal housing 30. Note that, fastening heat sink plate 40 and fitting portion 31 to each other with bolts 40T fixes heat sink plate 40 and power semiconductor module 10 to metal housing 30 and defines the posture of heat sink plate 40.

Note that, in the manufacturing process of power conversion apparatus 1 according to the present embodiment, the work of inserting bolts 10T, 20T, 40T or the like for fixing the members in a direction parallel to lower-surface-side wall portion 30U of metal housing 30 is not required. Therefore, there is no possibility that a fixing operation is inhibited by a lateral wall portion of metal housing 30 when power semiconductor module 10 is fixed in metal housing 30. From this viewpoint, power conversion apparatus 1 according to the present embodiment also contributes to the efficiency improvement of the manufacturing process.

[Effect]

As described above, according to power conversion apparatus 1 according to the present embodiment, it is possible to house power semiconductor module 10 in metal housing 30 in a vertically placed state while sufficiently ensuring the heat dissipation capacity for heat from power semiconductor module 10. It is thus possible to simultaneously achieve the improvement of the cooling capacity of power semiconductor module 10 and the space saving for arrangement of the components in metal housing 30.

Embodiment 2

Figure 7:
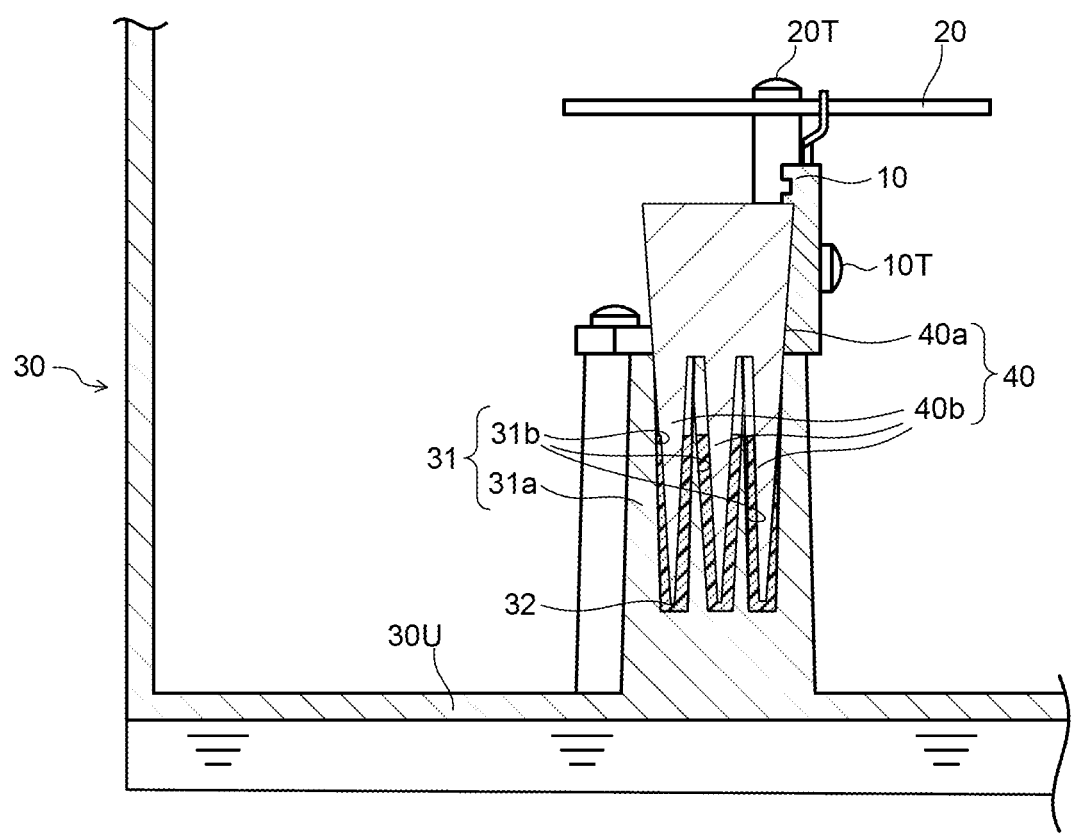
FIG. 7 is a sectional side view illustrating a configuration of the power conversion apparatus according to Embodiment 2.

Next, with reference to FIG. 7, a configuration of power conversion apparatus 1 according to Embodiment 2 will be described. FIG. 7 is a sectional side view illustrating the configuration of power conversion apparatus 1 according to Embodiment 2.

A heat sink structure of power conversion apparatus 1 according to the present embodiment is different from that of Embodiment 1 in a fitting structure between heat sink plate 40 and fitting portion 31 of metal housing 30. Note that, the descriptions of the components common between Embodiments 1 and 2 will be omitted (hereinafter, the same applies to other embodiments).

In heat sink plate 40 according to the present embodiment, insertion portion 40b is formed by a plurality of protrusions (here, three protrusions). Further, fitting portion 31 includes a plurality of slit portions 31b (here, three slit portions 31b) corresponding respectively to the plurality of protrusions of insertion portion 40b of heat sink plate 40.

In power conversion apparatus 1 according to the present embodiment having such a configuration, the plurality of protrusions of insertion portion 40b of heat sink plate 40 are disposed to be inserted into the plurality of slit portions 31b of fitting portion 31, respectively.

Such a configuration makes it possible to increase the contact area between heat sink plate 40 and fitting portion 31, to further reduce the thermal resistance at the time of heat transfer from heat sink plate 40 to fitting portion 31.

Embodiment 3

Figure 8:
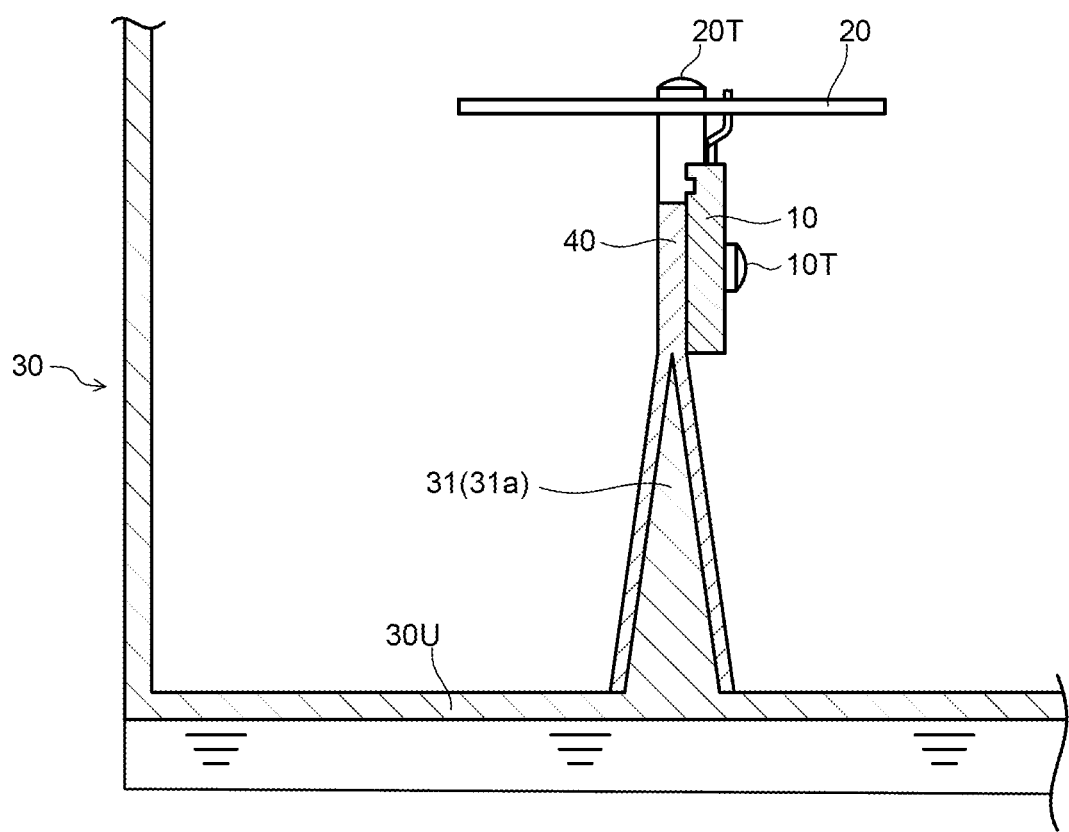
FIG. 8 is a sectional side view illustrating a configuration of the power conversion apparatus according to Embodiment 3.

Next, with reference to FIG. 8, a configuration of power conversion apparatus 1 according to Embodiment 3 will be described. FIG. 8 is a sectional side view illustrating an example of the configuration of power conversion apparatus 1 according to Embodiment 3.

A heat sink structure of power conversion apparatus 1 according to the present embodiment is different from that of Embodiment 1 in a fitting structure between heat sink plate 40 and fitting portion 31.

Heat sink plate 40 according to the present embodiment has a portion to be fitted to fitting portion 31 (i.e., the lower-end-side portion of heat sink plate 40) of a bifurcated structure. Further, fitting portion 31 according to the present embodiment (protruding portion 31a) has a shape that fits to the bifurcated portion of heat sink plate 40.

In power conversion apparatus 1 according to the present embodiment having such a configuration, the bifurcated portion of heat sink plate 40 is disposed to externally hold fitting portion 31 (protruding portion 31a) in between.

Such a configuration also makes it possible to house power semiconductor module 10 in metal housing 30 in a vertically placed state while sufficiently ensuring the heat dissipation capacity for heat from power semiconductor module 10.

Note that, in the case of Embodiment 3, it is possible to fill a gap between heat sink plate 40 and fitting portion 31 with heat transfer material 32 by reversing heat sink plate 40 and metal housing 30 at the time of manufacture, by filling the bifurcated portion of heat sink plate 40 with heat transfer material 32, and by fitting fitting portion 31 to the bifurcated portion. In addition, heat transfer material 32 may be interposed by filling the bifurcated portion of heat sink plate 40 with heat transfer material 32 and fitting fitting portion 31 to the bifurcated portion after heat transfer material 32 becomes a semi-solid state.

Embodiment 4

Figure 9:
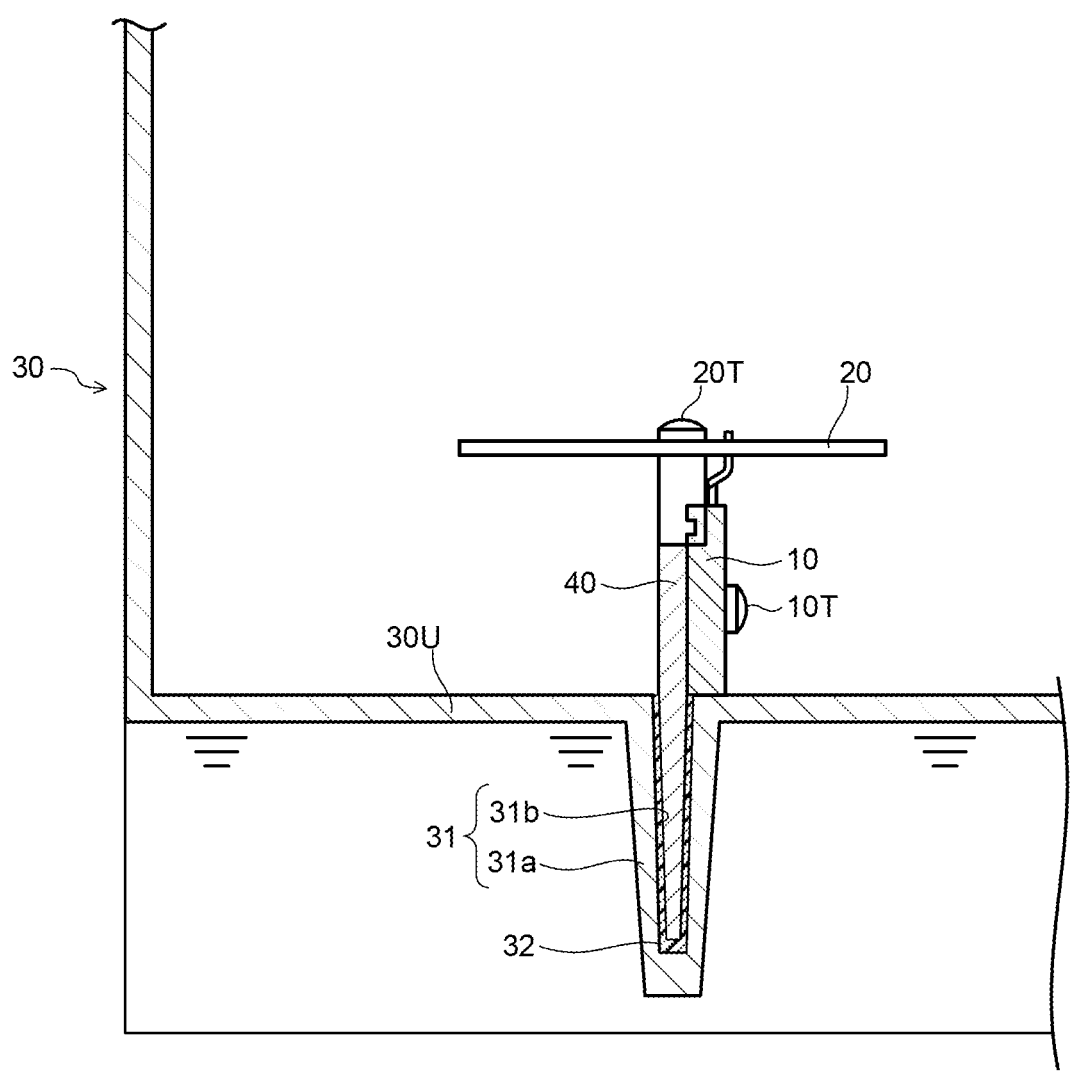
FIG. 9 is a sectional side view illustrating a configuration of the power conversion apparatus according to Embodiment 4.

Next, with reference to FIG. 9, a configuration of power conversion apparatus 1 according to Embodiment 4 will be described. FIG. 9 is a sectional side view illustrating the configuration of power conversion apparatus 1 according to Embodiment 4.

A heat sink structure of power conversion apparatus 1 according to the present embodiment is different from that of Embodiment 1 in a fitting structure between heat sink plate 40 and fitting portion 31.

Protruding portion 31a of fitting portion 31 according to the present embodiment is configured to protrude downward from flat portion 30Ua of lower-surface-side wall portion 30U. In other words, lower-surface-side wall portion 30U itself also protrude downward to the outside. Slit portion 31b in which heat sink plate 40 is inserted is formed in protruding portion 31a along the upper-lower direction.

In power conversion apparatus 1 according to the present embodiment having such a configuration, heat sink plate 40 is disposed to be inserted into slit portion 31b similarly to power conversion apparatus 1 according to Embodiment 1.

Such a configuration also makes it possible to house power semiconductor module 10 in metal housing 30 in a vertically placed state while sufficiently ensuring the heat dissipation capacity for heat from power semiconductor module 10. Note that, according to the heat sink structure according to the present embodiment, it is also possible to increase the contact area between lower-surface-side wall portion 30U and the refrigerant, so as to further enhance the cooling capacity.

Embodiment 5

Figure 10:
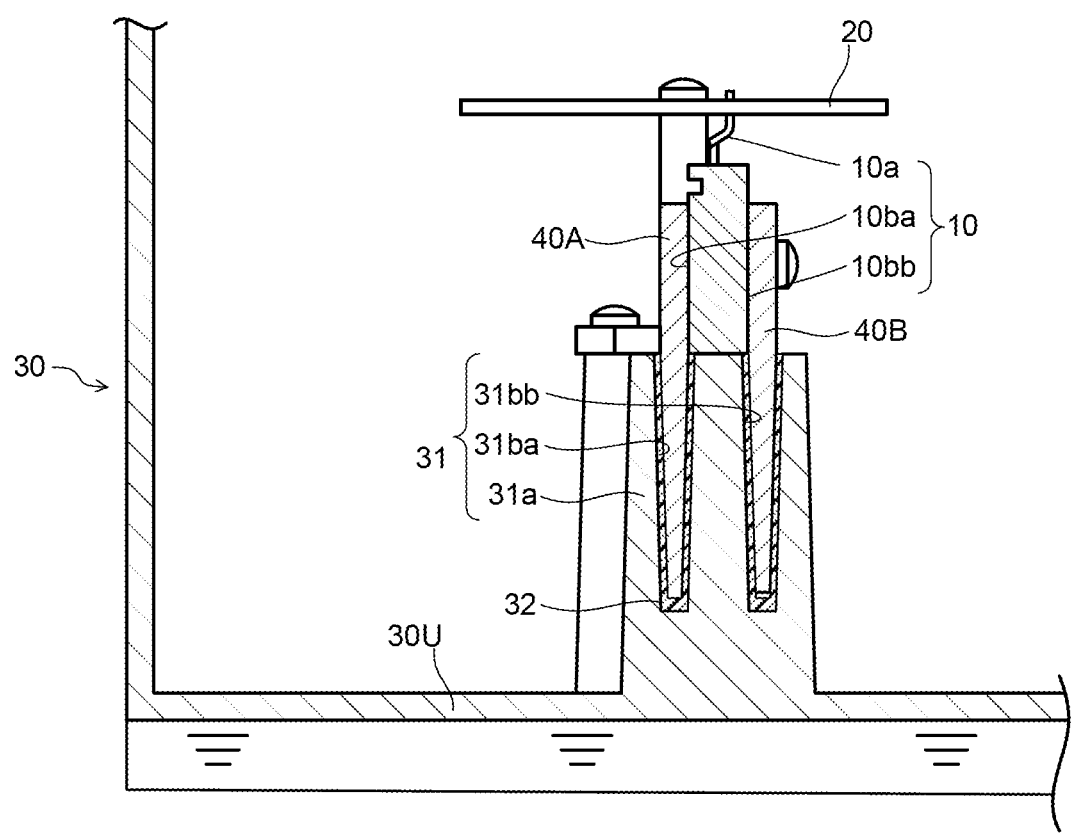
FIG. 10 is a sectional side view illustrating a configuration of the power conversion apparatus according to Embodiment 5.

Next, with reference to FIG. 10, a configuration of power conversion apparatus 1 according to Embodiment 5 will be described. FIG. 10 is a sectional side view illustrating the configuration of power conversion apparatus 1 according to Embodiment 5.

A heat sink structure of power conversion apparatus 1 according to the present embodiment is different from that of Embodiment 1 in that the heat sink structure in the present embodiment is a structure for cooling power semiconductor module 10 having heat dissipation surfaces 10ba and 10bb on both lateral side surfaces.

Power conversion apparatus 1 according to the present embodiment includes first heat sink plate 40A attached to heat dissipation surface 10ba on one side of power semiconductor module 10, and second heat sink plate 40B attached to heat dissipation surface 10bb on the other side of power semiconductor module 10. First heat sink plate 40A and second heat sink plate 40B have the same structure as heat sink plate 40 described in Embodiment 1.

Further, fitting portion 31 according to the present embodiment includes first slit portion 31ba in which first heat sink plate 40A is inserted, and second slit portion 31bb in which second heat sink plate 40B is inserted.

In power conversion apparatus 1 according to the present embodiment having such a configuration, first heat sink plate 40A and second heat sink plate 40B are attached respectively to heat dissipation surfaces 10ba and 10bb of power semiconductor module 10, first heat sink plate 40A is inserted into first slit portion 31ba, and second heat sink plate 40B is inserted into second slit portion 31bb. With such a configuration, it is possible to double the heat dissipation path for heat from power semiconductor module 10.

As described above, according to power conversion apparatus 1 according to the present embodiment, it is possible to further increase the heat dissipation capacity for heat from power semiconductor module 10.

While concrete examples of the present invention have been described in detail above, those examples are mere examples and do not limit the scope of the appended claims. The techniques disclosed in the scope of the appended claims include various modifications and variations of the concrete examples exemplified above.

For example, the example has been described in which the height of the sidewalls of metal housing 30 is higher than the height to bolts 10T after power semiconductor module 10 is housed and disposed in metal housing 30, but the present disclosure is not limited thereto and the height of the sidewalls may be lower than the height to bolts 10T.

This is because, even when a power conversion apparatus includes the sidewalls of metal housing 30 with a height lower than the height to bolts 10T, such a power conversion apparatus has the following similar problem: when the power conversion apparatus includes, around power semiconductor module 10, components (e.g., transformer and/or capacitor) with a height higher than the height to bolts 10T, it is difficult to fasten the power semiconductor module with bolts 10T in the horizontal direction after power semiconductor module 10 is housed and disposed in metal housing 30. (See FIG. 5)

That is, the effects of the present invention are exerted remarkably on a structure or component arrangement of metal housing 30 in which it is difficult to fasten power semiconductor module 10 with bolts 10T in the horizontal direction after power semiconductor module 10 is housed and disposed in metal housing 30.

Further, the above embodiment has been described in relation to the example in which lower-surface-side wall portion 30U of metal housing 30 is the heat dissipation surface (makes external contact with the refrigerant) and fitting portion 31 is thus formed as part of lower-surface-side wall portion 30U, but fitting portion 31 may be formed on a wall portion other than lower-surface-side wall portion 30U.

For example, when an upper wall makes external contact with the refrigerant in a case where metal housing 30 is configured such that a lid composed of the sidewalls and the upper wall integrally molded is placed on the shape made only of a lower-surface-side wall portion, fitting portion 31 may be formed as a part of the upper wall.

That is, the present invention is applicable to any structure in which, in a housing space of a housing, the fitting portion is formed as a part of a wall portion (heat dissipation wall portion) facing a refrigerant at the outside of the housing space of the housing.

This application is entitled to and claims the benefit of Japanese Patent Application No. 2018-242430 dated Dec. 26, 2018, the disclosure of which including the specification, drawings and abstract is incorporated herein by reference in its entirety.

INDUSTRIAL APPLICABILITY

A power conversion apparatus according to the present disclosure allows an arrangement in which a power semiconductor module is vertically placed, and is capable of sufficiently ensuring a heat dissipation capacity for heat from the power semiconductor module.

REFERENCE SIGNS LIST

1 Power conversion apparatus
10 Power semiconductor module (semiconductor component)
10a Terminal
10b, 10ba, 10bb Heat dissipation surface
20 Circuit board
30 Metal housing
30U Lower-surface-side wall portion
30Ua Flat portion
31 Fitting portion
31a Protruding portion
31b, 31ba, 31bb Slit portion
31c Bolt hole
32 Adhesive (heat transfer material)
40, 40A, 40B Heat sink plate (heat transfer member)
40a Attachment portion
40b Insertion portion
40c Through-hole
10T, 20T, 40T Bolt (fastening member)

The invention claimed is:
1. A power conversion apparatus, comprising:
a semiconductor component for power conversion;
a heat transfer member to which the semiconductor component is fixed such that the heat transfer member is thermally connected to a heat dissipation surface formed on at least one surface of the semiconductor component; and
a housing having a housing space for housing the semiconductor component and the heat transfer member,
wherein the housing includes a heat dissipation wall portion facing a refrigerant at an outside of the housing space, a fitting portion that fits to the heat transfer member is formed on the heat dissipation wall portion at an inside of the housing space, an area of contact between the fitting portion and the heat transfer member is greater than an area of the heat dissipation surface of the semiconductor component, and an occupied area of the fitting portion as seen in plan view is smaller than an area of the at least one surface of the semiconductor component on which the heat dissipation surface is formed, and wherein the fitting portion includes a protruding portion protruding upward from a flat portion of the heat dissipation wall portion, and a slit portion extending in the protruding portion along an upper-lower direction and being configured such that the heat transfer member is insertable into the slit portion.

2. The power conversion apparatus according to claim 1, wherein the heat dissipation wall portion of the metal housing makes external contact with a water refrigerant.

3. The power conversion apparatus according to claim 1, wherein the heat transfer member has a plate shape.

4. A power conversion apparatus according to claim 1, comprising:
a semiconductor component for power conversion;
a heat transfer member to which the semiconductor component is fixed such that the heat transfer member is thermally connected to a heat dissipation surface formed on at least one surface of the semiconductor component; and
a housing having a housing space for housing the semiconductor component and the heat transfer member,
wherein the housing includes a heat dissipation wall portion facing a refrigerant at an outside of the housing space, a fitting portion that fits to the heat transfer member is formed on the heat dissipation wall portion at an inside of the housing space, an area of contact between the fitting portion and the heat transfer member is greater than an area of the heat dissipation surface of the semiconductor component, and an occupied area of the fitting portion as seen in plan view is smaller than an area of the at least one surface of the semiconductor component on which the heat dissipation surface is formed, and
wherein the fitting portion includes a protruding portion protruding downward from a flat portion of the heat dissipation wall portion, and a slit portion extending in the protruding portion along an upper-lower direction and being configured such that the heat transfer member is insertable into the slit portion.

5. The power conversion apparatus according to claim 1, wherein the heat transfer member is thermally coupled to the fitting portion in the fitting portion at least partially via a heat transfer material.

6. The power conversion apparatus according to claim 1, wherein the semiconductor component is electrically connected to a circuit board via a terminal disposed on an upper end of the semiconductor component, the circuit board being disposed above the semiconductor component to extend substantially parallel to a flat portion of the heat dissipation wall portion.

7. The power conversion apparatus according to claim 6, wherein a plurality of the semiconductor components are disposed below the circuit board, a plurality of the heat transfer members are disposed to hold the plurality of semiconductor components, respectively, and a plurality of the fitting portions are formed such that the plurality of heat transfer members are fitted and fixed respectively to the plurality of fitting portions.

8. The power conversion apparatus according to claim 1, wherein the semiconductor component is a power semiconductor module.

9. A power conversion apparatus, comprising:
a semiconductor component for power conversion;
a heat transfer member to which the semiconductor component is fixed such that the heat transfer member is thermally connected to a heat dissipation surface formed on at least one surface of the semiconductor component; and
a housing having a housing space for housing the semiconductor component and the heat transfer member,
wherein the housing includes a heat dissipation wall portion facing a refrigerant at an outside of the housing space, a fitting portion that fits to the heat transfer member is formed on the heat dissipation wall portion at an inside of the housing space, an area of contact between the fitting portion and the heat transfer member is greater than an area of the heat dissipation surface of the semiconductor component, and an occupied area of the fitting portion as seen in plan view is smaller than an area of the at least one surface of the semiconductor component on which the heat dissipation surface is formed, and
wherein the fitting portion has a shape with an indentation and a protrusion.

10. The power conversion apparatus according to claim 1, wherein the semiconductor component and the heat transfer member are disposed in a vertically placed state.

11. The power conversion apparatus according to claim 1, wherein the housing is a metal housing.

12. The power conversion apparatus according to claim 1, wherein the housing is box-shaped, and a height of a peripheral wall portion of the housing is higher than a position of an upper end of the semiconductor component.

13. The power conversion apparatus according to claim 1, wherein the housing houses an electrical component other than the semiconductor component, the electrical component extending to a position higher than a position of an upper end of the fitting portion.

14. The power conversion apparatus according to claim 1, wherein the semiconductor component is fastened to the heat transfer member with a fastening member.

15. The power conversion apparatus according to claim 1, wherein the heat transfer member is fastened to the fitting portion with a fastening member.

* * * * *